US008180605B1

(12) United States Patent
Zhu

(10) Patent No.: US 8,180,605 B1
(45) Date of Patent: May 15, 2012

(54) METHODS AND SYSTEMS FOR CREATING A SMOOTH CONTACT-IMPACT INTERFACE IN FINITE ELEMENT ANALYSIS

(75) Inventor: Xin-Hai Zhu, Pleasanton, CA (US)

(73) Assignee: Livermore Software Technology Corporation, Livermore, CA (US)

( * ) Notice: Subject to any disclaimer, the term of this patent is extended or adjusted under 35 U.S.C. 154(b) by 409 days.

(21) Appl. No.: 12/468,761

(22) Filed: May 19, 2009

Related U.S. Application Data

(63) Continuation-in-part of application No. 11/287,016, filed on Nov. 23, 2005, now abandoned.

(51) Int. Cl.
G06F 17/17 (2006.01)

(52) U.S. Cl. ...................................... 703/2; 703/1; 703/6

(58) Field of Classification Search .................. 703/1, 2, 703/6
See application file for complete search history.

(56) References Cited

U.S. PATENT DOCUMENTS

| | | | |
|---|---|---|---|
| 5,189,626 A | | 2/1993 | Colburn |
| 5,390,127 A * | | 2/1995 | Tang et al. ..................... 700/146 |
| 5,557,719 A * | | 9/1996 | Ooka et al. ..................... 345/441 |
| 5,602,979 A | | 2/1997 | Loop |
| 5,608,856 A | | 3/1997 | McInally |
| 5,625,575 A * | | 4/1997 | Goyal et al. ....................... 703/6 |
| 6,083,268 A * | | 7/2000 | Kelsey et al. ..................... 703/7 |
| 6,195,625 B1 * | | 2/2001 | Day et al. ........................... 703/7 |
| 6,226,007 B1 | | 5/2001 | Brown |
| 6,226,405 B1 * | | 5/2001 | Furuhata et al. ............... 382/197 |
| 6,256,038 B1 * | | 7/2001 | Krishnamurthy ............. 345/419 |
| 6,271,856 B1 * | | 8/2001 | Krishnamurthy ............. 345/581 |
| 6,338,000 B1 * | | 1/2002 | Nakajima et al. ............... 700/97 |
| 6,342,886 B1 * | | 1/2002 | Pfister et al. .................... 345/424 |
| 6,353,768 B1 * | | 3/2002 | Karafillis et al. ............... 700/97 |
| 6,560,570 B1 * | | 5/2003 | Dohrmann et al. ................ 703/7 |
| 6,573,892 B1 * | | 6/2003 | Yang et al. ..................... 345/421 |
| 6,600,485 B1 | | 7/2003 | Yoshida et al. |
| 6,678,642 B1 * | | 1/2004 | Budge ............................... 703/2 |
| 6,867,774 B1 | | 3/2005 | Halmshaw et al. |
| 6,876,956 B1 * | | 4/2005 | Cirak et al. ....................... 703/2 |
| 6,975,750 B2 | | 12/2005 | Yan et al. |
| 7,015,917 B2 | | 3/2006 | Uesaki et al. |

(Continued)

OTHER PUBLICATIONS

M. A. Puso, and T. A. Laursen, "A 3D contact smoothing method using Gregory Patches", pp. 1161-11-94, Published in 2002 by John Wiley & Sons, Ltd.*

(Continued)

Primary Examiner — Kamini S Shah
Assistant Examiner — Kibrom Gebresilassie
(74) Attorney, Agent, or Firm — Roger H. Chu

(57) ABSTRACT

Improved systems and methods of creating a smooth contact-impact interface (i.e., a curve fitted surface) in finite element analysis are disclosed. According to one aspect, a smooth contact interface is created for a master segment used for simulating contacts. First, for every nodal point in the master segment, a list of elements that share at least the node is determined. Then a nodal normal vector is calculated using a weighted average of respective element normal vectors of all elements in the list. The calculated nodal normal vector is adjusted for special edge effect, which is an intersection between flat and curved geometries. A set of edge control points are created using a pair of adjacent corner nodes. A mid-element control point is further created for quadrilateral shell elements. The smooth contact interface is configured to encompass all corner nodes and all of the control points.

20 Claims, 10 Drawing Sheets

U.S. PATENT DOCUMENTS

| | | | |
|---|---|---|---|
| 7,167,816 B1* | 1/2007 | Olovsson | 703/1 |
| 7,212,205 B2* | 5/2007 | Uesaki et al. | 345/423 |
| 7,219,039 B1* | 5/2007 | Shepherd et al. | 703/2 |
| 7,286,127 B2* | 10/2007 | Zhou et al. | 345/420 |
| 7,363,198 B2* | 4/2008 | Balaniuk et al. | 703/2 |
| 7,373,287 B2 | 5/2008 | Asper | |
| 7,451,637 B2 | 11/2008 | Kuwajima et al. | |
| 7,610,184 B1* | 10/2009 | Tillman et al. | 703/2 |
| 7,653,517 B2* | 1/2010 | Oba et al. | 703/1 |
| 8,050,897 B2* | 11/2011 | Teng et al. | 703/2 |
| 8,111,256 B2* | 2/2012 | Chen et al. | 345/423 |
| 2002/0018216 A1* | 2/2002 | Kawasaki et al. | 356/601 |
| 2003/0016217 A1* | 1/2003 | Vlachos et al. | 345/423 |
| 2003/0074174 A1* | 4/2003 | Fu et al. | 703/13 |
| 2004/0073323 A1* | 4/2004 | Zhu et al. | 700/31 |
| 2004/0090437 A1* | 5/2004 | Uesaki et al. | 345/420 |
| 2004/0176863 A1* | 9/2004 | Ren et al. | 700/98 |
| 2005/0001363 A1* | 1/2005 | Oba et al. | 266/80 |
| 2006/0020868 A1* | 1/2006 | Richardson et al. | 714/752 |
| 2006/0031046 A1* | 2/2006 | Asper | 703/2 |
| 2006/0290693 A1* | 12/2006 | Zhou et al. | 345/420 |
| 2008/0082192 A1* | 4/2008 | Perez Garraleta | 700/98 |
| 2009/0091567 A1* | 4/2009 | Fu et al. | 345/419 |
| 2010/0145662 A1* | 6/2010 | Teng et al. | 703/1 |

OTHER PUBLICATIONS

USPTO—Office Action Mailed Jul. 10, 2008 (U.S. Appl. No. 11/287,016, filed Nov. 23, 2005).

Response to the Jul. 10, 2008 Office Action (U.S. Appl. No. 11/287,016, filed Nov. 23, 2005)—Aug. 21, 2008.

Unstructured MEL modelling of nonlinear unsteady ship waves, Q. X. Wang, Journal of Computational Physics 210 (2005) 368-385.

A 3D contact smoothing method using Gregory patches, Puso et al., International Journal for Numerical Methods in Engineering 2002: 54: 1161-1194.

Cn Continuous Modelling of Smooth Contact Surfaces Using NURBS and Application to 2D Problems, Stadler et al., nternational Journal for Numerical Methods in Engineering 2003:57: 2177-2203.

USPTO—Office Action Mailed Nov. 10, 2008 (U.S. Appl. No. 11/287,016, filed Nov. 23, 2005).

Response to the Nov. 10, 2008 Office Action (U.S. Appl. No. 11/287,016, filed Nov. 23, 2005)—Dec. 9, 2008.

Smooth spline surface generation over meshes of irregular topology, Zheng et al., Visual Computing (2005) 21:858-864 Published online Sep. 1, 2005.

Contact treatment algorithm for the trimmed NURBS surface, Shim et al., Journal of Materials Processing Technology 104 (2000) 200-206.

Surface modelling and mesh generation for simulating superplastic forming, Lin et al, Journal of Materials Processing Technology 80-81 (1998) 613-619.

Smooth Spline Surfaces over Irregular Meshes, Loop, SIGGRAPH '94, Jul. 24-29.

USPTO—Office Action Mailed Dec. 23, 2008 (U.S. Appl. No. 11/287,016, filed Nov. 23, 2005).

USPTO—Office Action Mailed Feb. 25, 2009 (U.S. Appl. No. 11/287,016, filed Nov. 23, 2005).

Response to the Feb. 25, 2009 Office Action (U.S. Appl. No. 11/287,016, filed Nov. 23, 2005)—May 19, 2009.

USPTO—Office Action Mailed Jul. 7, 2009 (U.S. Appl. No. 11/287,016, filed Nov. 23, 2005).

EFS contact searching algorithm for dynamic finite element analysis, Wang et al., International Journal for Numerical Methods in Engineering 2001: 52: 655-672.

* cited by examiner

METHODS AND SYSTEMS FOR CREATING A SMOOTH CONTACT-IMPACT INTERFACE IN FINITE ELEMENT ANALYSIS

CROSS-REFERENCE TO RELATED APPLICATION

This application is a continuation-in-part of a U.S. patent application Ser. No. 11/287,016, Now abandoned, for "Method and system for contact-impact based on a smooth curve-fitted surface during the FEM analysis of a structure" filed Nov. 23, 2005. The content of which is incorporated by reference in its entirety.

FIELD OF THE INVENTION

The present invention generally relates to computer aided engineering analysis, more particularly to methods and systems for creating an improved smooth contact-impact interface in a finite element analysis used for engineering simulation for assisting users to make decision in improvement of an engineering product or structure design.

BACKGROUND OF THE INVENTION

Finite element analysis (FEA) is a computerized method widely used in industry to model and solve engineering problems related to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

One of the most challenging FEA tasks is to simulate a contact-impact event such as car crash or metal forming. Traditionally, shell elements (i.e., flat surfaces) are used in FEA to represent a master segment used for contacts, for example, triangle or quadrilateral. In an impact event, two portions of a structure are in contact with each other. Using flat surfaces to approximate a curved geometry creates a problem in simulation such event. Finite element discretization of such surface generally needs high mesh density (i.e., very fine mesh) for curved geometry, this leads to an unnecessarily large and complex FEA model hence requiring long computations for the simulation.

Additionally, the computer simulated contact is based on an algorithm including a master segment and a slave node to represent the two contact portions of the structure. Using a flat segment to approximate a curved surface could cause another problem. The simulated contact would occur only when the approximated flat portion of a master segment is in contact with a slave node. But the physical contact between two portions of the structure may have already occurred because the curvature of the surface had not been considered in prior art approach, or vice versa. As a result, the approximation of using flat segment to approximate curved surface can generate different or sometimes erroneous results, thus leads to incorrect conclusion regarding the integrity of the structure.

Furthermore, prior art approach has yet another problem with respect to discontinuity of the surface normal at the intersection or node shared with several master segments due to different slopes. As a result, the discontinuity could cause numerical inaccuracy or an interface not including all nodes from the input geometry. Therefore, it would be desirable to have an improved method of creating a contact-impact interface in a finite element analysis that overcomes shortcomings, drawbacks and problems of the prior art approaches.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

The present invention discloses a system, method and software product for creating a smooth contact-impact interface (i.e., a curve fitted surface) to represent a master segment used for simulating contacts in a finite element analysis used for engineering simulation for assisting users to make decision in improvement of an engineering product design.

According to one aspect of the present invention, a finite element analysis model is created for an engineering product or structure. To anticipate contacts between two portions of the structure during a time-marching engineering simulation, a master-slave contact scheme is employed. Contacts or potential contacts are checked between a master segment and each of a group of slave nodes. The master segment is configured to include a potential contact surface of the structure as a surface comprising a plurality of two-dimensional finite elements (i.e., triangular and quadrilateral shell elements). However, in order to simulate contact more realistically, the master segment is represented by a smooth curve-fitted surface that includes all nodes from input geometry. The smooth curve-fitted surface is created using a curve fitting technique including, but not limited to, B-spline, smooth patch method, and alike.

According to another aspect, a smooth contact interface is created to encompass all nodal points of each element in a master segment. For every nodal point in the master segment, a list of elements that share at least the node is determined. Then a nodal normal vector is calculated using a weighted average of respective element normal vectors of all elements in the list. The calculated nodal normal vector is adjusted for a special edge effect, if the node is located at such edge. The special edge is an intersection between flat and curved faces. The special edge is detected when any nodal normal vector is parallel to the element normal.

According to yet another aspect, a set of control points for each element of the master segments is created to facilitate the description of the smooth curve-fitted surface. This is to ensure the continuity of the curve-fitted surface at a corner node that is shared among elements in the master segment. First, each edge control point is created using a pair of corner nodes of each edge of the element. The edge control points may or may not locate at the same plane of the element. For a quadrilateral element, one mid-element control point is created substantially close to the center of the element. The smooth curve-fitted surface is constructed based on all of these control points, thus a more realistic contact surface can be represented.

According to yet another aspect, the contact between two portions of the structure is detected based upon the distance and normal vector between each of the slave nodes and its projection on the smooth curve-fitted surface.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIGS. 3A-1 is a diagram showing an exemplary special edge condition of nodal normal vector that requires adjustment, according to an embodiment of the present invention;

DETAILED DESCRIPTION

Figure 1:
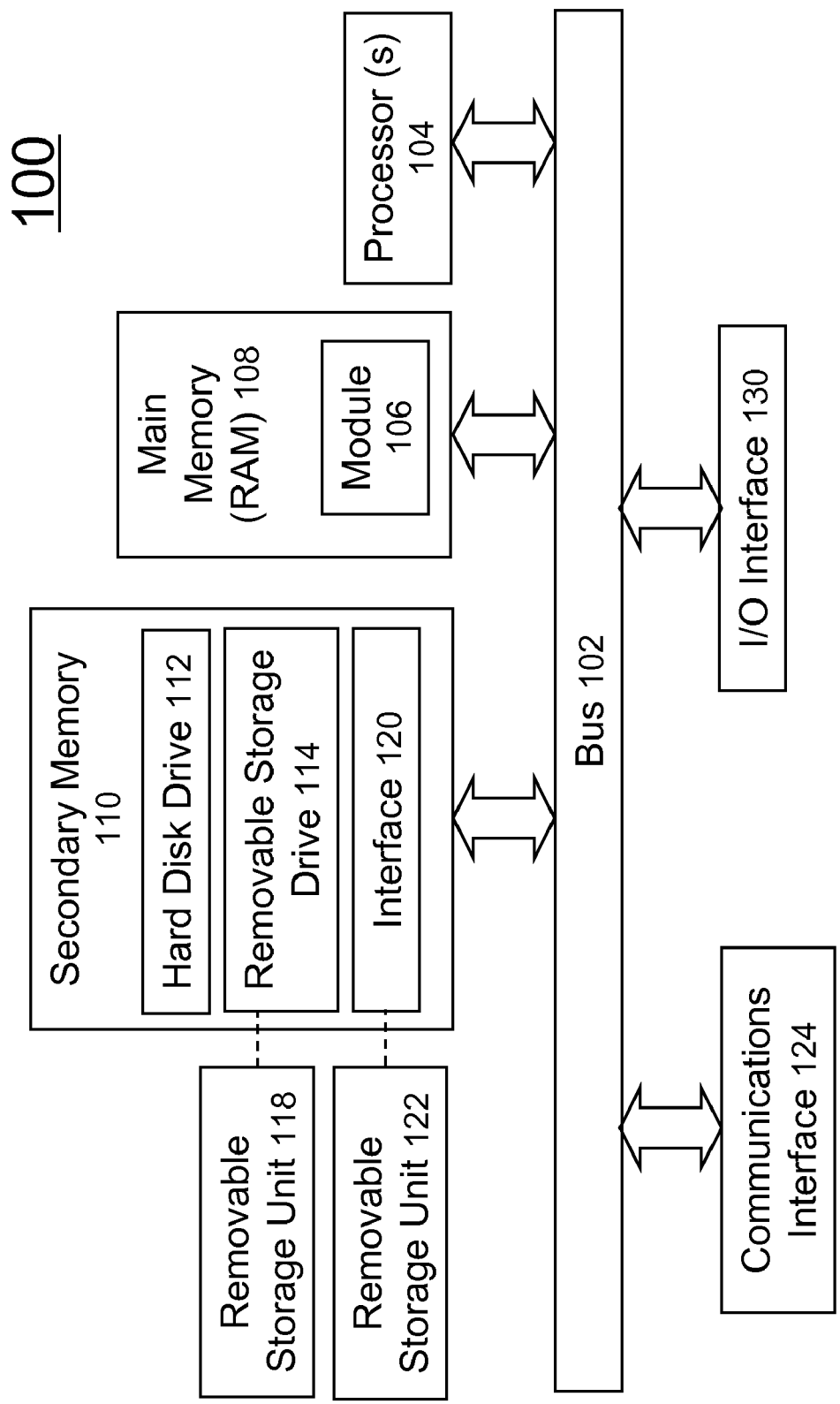
FIG. 1 is a functional block diagram showing salient components of an exemplary computer, in which one embodiment of the present invention may be implemented.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

FEM stands for Finite Element Method.

Implicit FEA refers to Ku=F, where K is the effective stiffness matrix, u is the unknown displacement array and F is the effective loads array. F is a right hand side loads array while K is a left hand side stiffness matrix. The solution is performed at the global level with a factorization of the effective stiffness matrix, which is function of the stiffness, mass and damping. One exemplary solution method is the Newmark integration scheme.

Explicit FEA refers to Ma=F, where M is the diagonal mass array, a is the unknown nodal acceleration array and F is the effective loads array. The solution can be carried out at element level without factorization of a matrix. One exemplary solution method is called the central difference method.

Time-march simulation refers to a FEA that simulates a physical phenomenon in time domain. One of the solution methods for the time-marching simulation is direct integration scheme, which may be carried out as either implicit or explicit solution schemes.

Dynamic analysis refers to a FEA that accounts for the mass and inertia effects of a structure. In general, there are two classes of dynamic analysis: time domain and frequency domain.

Solution cycle or cycle is used interchangeably to refer to the numbered solution states starting with cycle 0 at time t=0.

The time step $\Delta t$ refers to an interval of time between subsequent cycles.

Embodiments of the present invention are discussed herein with reference to FIGS. 1-6. However, those skilled in the art will readily appreciate that the detailed description given herein with respect to these figures is for explanatory purposes as the invention extends beyond these limited embodiments.

Referring now to the drawings, in which like numerals refer to like parts throughout several views. The present invention may be implemented using hardware, software or a combination thereof and may be implemented in a computer system or other processing system. In fact, in one embodiment, the invention is directed towards one or more computer systems capable of carrying out the functionality described herein. An example of a computer system 100 is shown in FIG. 1. The computer system 100 includes one or more processors, such as processor 104. The processor 104 is connected to a computer system internal communication bus 102. Various software embodiments are described in terms of this exemplary computer system. After reading this description, it will become apparent to a person skilled in the relevant art(s) how to implement the invention using other computer systems and/or computer architectures.

Computer system 100 also includes a main memory 108, preferably random access memory (RAM), and may also include a secondary memory 110. The secondary memory 110 may include, for example, one or more hard disk drives 112 and/or one or more removable storage drives 114, representing a floppy disk drive, a magnetic tape drive, an optical disk drive, etc. The removable storage drive 114 reads from and/or writes to a removable storage unit 118 in a well-known manner. Removable storage unit 118, represents a floppy disk, magnetic tape, optical disk, etc. which is read by and written to by removable storage drive 114. As will be appreciated, the removable storage unit 118 includes a computer usable storage medium having stored therein computer software and/or data.

In alternative embodiments, secondary memory 110 may include other similar means for allowing computer programs or other instructions to be loaded into computer system 100. Such means may include, for example, a removable storage unit 122 and an interface 120. Examples of such may include a program cartridge and cartridge interface (such as that found in video game devices), a removable memory chip (such as an EPROM, or PROM) and associated socket, and other removable storage units 122 and interfaces 120 which allow software and data to be transferred from the removable storage unit 122 to computer system 100. In general, Computer system 100 is controlled and coordinated by operating system (OS) software, which performs tasks such as process scheduling, memory management, networking and I/O services.

There may also be a communications interface 124 connecting to the bus 106. Communications interface 124 allows software and data to be transferred between computer system 100 and external devices. Examples of communications interface 124 may include a modem, a network interface (such as an Ethernet card), a communications port, a PCMCIA slot and card, etc.

The channel 126 facilitates a data flow between a data network and the computer 100 and typically executes a special set of rules (i.e., a protocol) to send data back and forth. One of the common protocols is TCP/IP (Transmission Control Protocol/Internet Protocol) commonly used in the Internet. In general, the communication interface 124 manages the assembling of a data file into smaller packets that are transmitted over the data network or reassembles received packets into the original data file. In addition, the communication interface 124 handles the address part of each packet so that it gets to the right destination or intercepts packets destined for the computer 100.

In this document, the terms "computer program medium" and "computer recordable storage medium" are used to generally refer to media such as removable storage drive 114 and a hard disk installed in hard disk drive 112. These computer program products are means for providing software to computer system 100. The invention is directed to such computer program products.

The computer system 100 may also include an I/O interface 130, which provides the computer system 100 to access monitor, keyboard, mouse, printer, scanner, plotter, and alike.

Computer programs (also called computer control logic) are stored as application modules 106 in main memory 108 and/or secondary memory 110. Computer programs may also be received via communications interface 124. Such computer programs, when executed, enable the computer system 100 to perform the features of the present invention as discussed herein. In particular, the computer programs, when executed, enable the processor 104 to perform the features of the present invention. Accordingly, such computer programs represent controllers of the computer system 100.

In an embodiment where the invention is implemented using software, the software may be stored in a computer program product and loaded into computer system 100 using removable storage drive 114, hard drive 112, or communications interface 124. The application module 106, when executed by the processor 104, causes the processor 104 to perform the functions of the invention as described herein.

In another embodiment, the present invention is implemented primarily in hardware using, for example, hardware components such as application specific integrated circuits (ASICs). Implementation of the hardware state machine so as to perform the functions described herein will be apparent to persons skilled in the relevant art(s). In yet another embodiment, the present invention is implemented using a combination of both hardware and software.

The main memory 108 may be loaded with one or more application modules 106 that can be executed by one or more processors 104 with or without a user input through the I/O interface 130 to achieve desired tasks. In operation, when at least one processor 104 executes one of the application modules 106, the results are computed and stored in the secondary memory 110 (i.e., hard disk drive 112). The status of the computation (e.g., the progress of a time-marching engineering simulation) is reported to the user via the I/O interface 130. The current deformed structure (e.g., the deformation due to contact) may be shown graphically for visual inspection. The graphical output is sent through the I/O interface 130 to a monitor.

In one embodiment, the application module is configured to use a finite element mesh representing the geometry of a structure including at least one master contact segment and a plurality of slave nodes for contacts. The finite element mesh includes a plurality of nodes and a plurality of elements. In another embodiment, the application module is configured to facilitate creation of a smooth contact interface with curve-fitted surface to represent the master contact segments. In yet another embodiment, an exemplary computer implemented method allows multiple computers perform in parallel to simulate the design and analysis of a structure.

Figure 2:
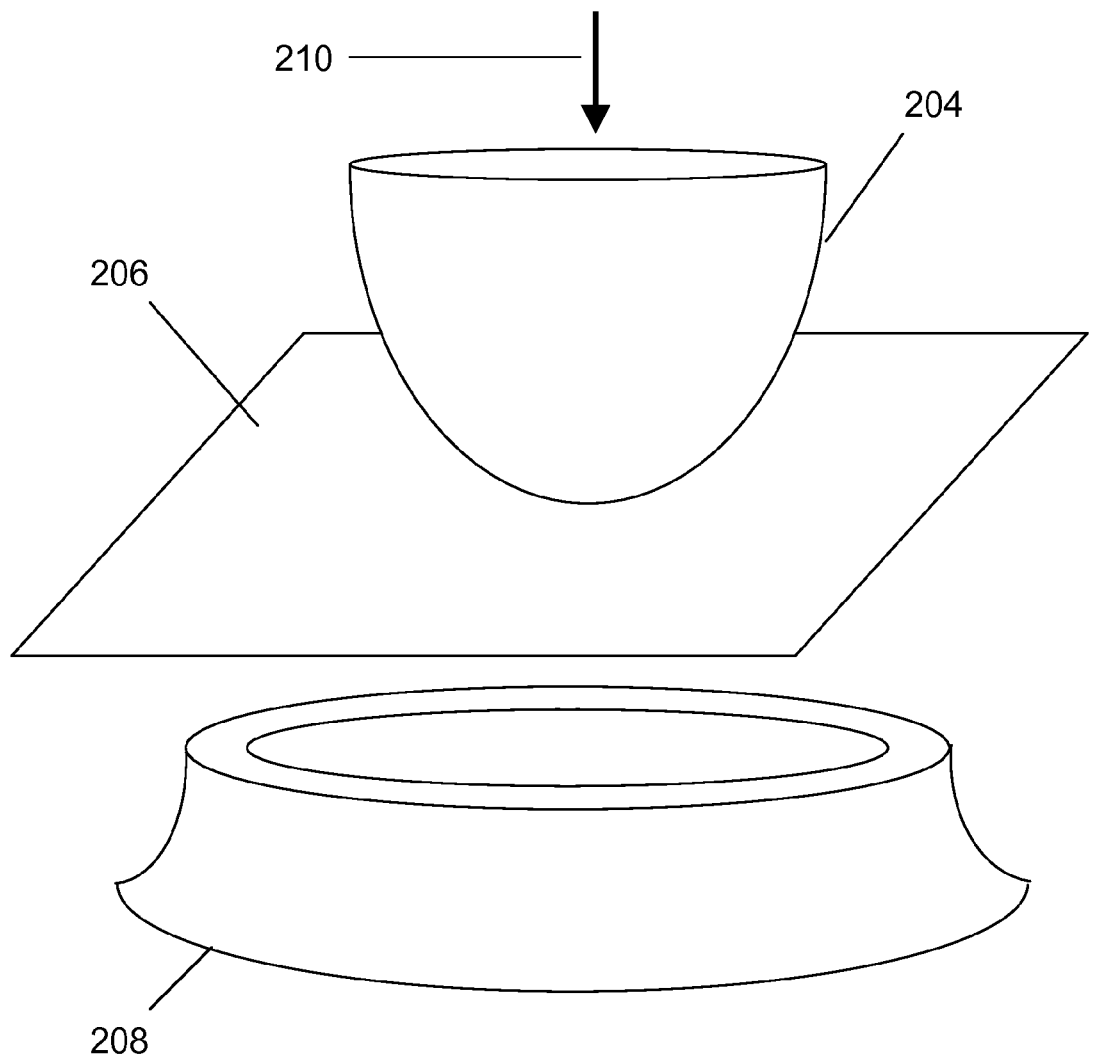
FIG. 2 is a diagram depicting an exemplary metal forming that can be simulated using an improved contact-impact interface in accordance with one embodiment of the present invention.

Referring now to FIG. 2, an exemplary metal forming setup showing contacts in a design and analysis of a structure in accordance with one embodiment of the present invention. In this embodiment, a metal stamping tool 204 is pressed onto a blank sheet metal 206 against a die 208 in the downward direction 210. As the stamping tool is pressed downward, there are two contacts occurred during this process: 1) the top side of the blank sheet metal 206 contacts the surface of the stamping tool 204, and 2) the bottom side of the blank sheet metal 206 contacts the surface of the die 208. Using FEA to simulate this metal forming process, the stamping tool 204, the blank sheet metal 206, and the die 208 are modeled with a number of finite elements (e.g., shell and/or solid elements). In order to simulate the contacts, the outside surface of the stamping tool 204 is designated as a number of master segments, which has a flat geometric shape: 3-node triangle or 4-node quadrilateral segments. In this example, all of the nodes representing the blank sheet metal 206 are designated as a plurality of slave nodes. Similarly, the outside surface of the die 208 is designated as another group of master segments, along with slave nodes of the blank sheet metal 206. During the time-marching engineering simulation of this metal forming, each of the slave nodes is checked against the master segments for contact at each time cycle. When a contact between any of the slave nodes and one of the master segments has been detected, a contact force is created to simulate the contact between these two portions of the structure. One of the common methods to model the contact force is to place a non-linear spring between the slave node and its perpendicular projection on the master segment in accordance with one embodiment. There are many other examples that may be used to demonstrate the contact in a design analysis of a structure. The setup as shown in FIG. 2 is used herein to exemplify what a contact problem is like in a structural analysis.

Figure 3A:
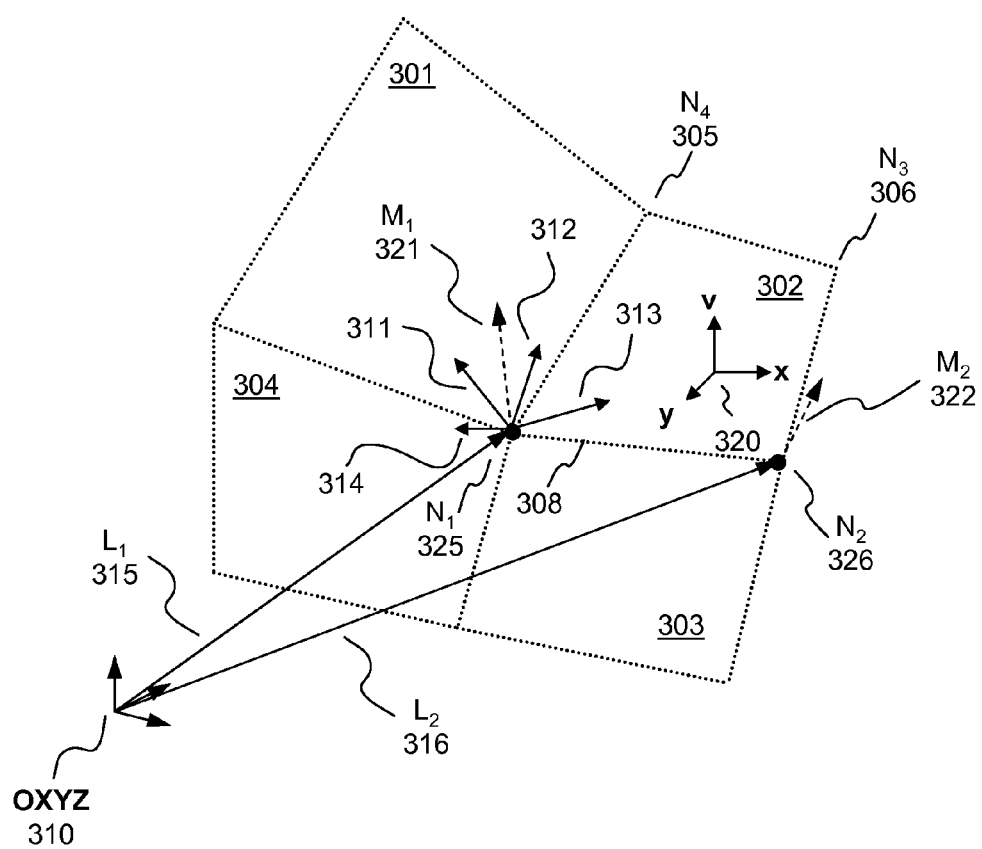
FIG. 3A is a diagram showing an exemplary nodal normal vector at a node shared by four quadrilateral elements in accordance with one embodiment of the present invention.
Figures 1, 3A:
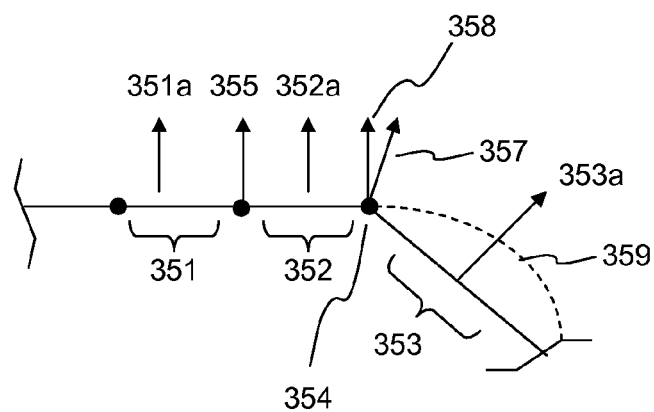

FIGS. 3A and 3A-1 collectively show an exemplary nodal normal vector creation based upon the adjacent segments and calculation of an exemplary control point in accordance with one embodiment of the present invention. In this embodiment, a global coordinate system OXYZ 310 is used to define the finite element model, which has a number of elements (e.g., triangular and quadrilateral shell elements) and at least one master segment designated for contacts. In FIG. 3A, there is shown four quadrilateral elements 301, 302, 303 and 304. The elements 301-4 share an intersection at a node $N_1$ 325. Each of these elements 301-4 is defined by a unique set of four corner nodes which may or may not be in a plane. For example, element 302 is defined by corner nodes $N_1$ 325, $N_2$ 326, $N_3$ 306 and $N_4$ 305. Although only quadrilateral segments are shown, other types of segment (e.g., triangle) may be used.

First, element normal vector is defined as a vector perpendicular to the plane of the elements 301-4. In the case of a warped quadrilateral element in which 4 nodes are not in the same plane, an equivalent element normal vector such as the cross product of the two diagonal vectors of the element is used. The nodal normal vector at node $N_1$ 325 has four element normal vectors 311-4 that are defined elements 301-4, respectively. When these elements are not orientated in a same plane, the element normal vectors 311, 312, 313 and 314 are different. This creates a discontinuity node $N_1$ 325. In order to accommodate a smooth contact interface (e.g., a curve-fitted surface thru node $N_1$ 325) with a continuous surface at each node and across all elements, a nodal normal vector is created by an average of all shared element normal. In one embodiment, a simple average method is used to create the nodal normal vector. In another embodiment, a weighted average method is used. For example, the choices of weight factor used in the weighted average method may include, but not limited to, the area and the angle respected to the corner node of the element, alone or in combination.

Once the nodal normal vector is calculated initially, a special edge condition is checked. It is determined whether the node is located at the special edge or intersection between flat and curved geometries of the master segment. If so, the calculated nodal normal vector is set to an element normal of the element located on the flat geometry. The flat geometry or feature of the master segment is detected when any one of the corner node's nodal normal vector of an element is parallel to the element normal vector. A two-dimension cross-sectional view of the special edge condition is shown in FIGS. 3A-1. An exemplary master segment (partially shown) includes at least elements 351-353. Elements 351-352 are located on a flat geometry or feature of the master segment while element 353 is located on a slanted to the flat geometry. Respective element normal vectors 351a-353a are calculated for the elements 351-353. When a smooth contact interface is created through node 354, a curved geometry 359 can be resulted. Nodal normal vector 357 is initially created by averaging element normal vectors 352a and 353a, and nodal normal vector 355 is created from element normal vectors 351a and 352a. Then a special edge condition is detected for node 354, because nodal normal vector 355 is parallel to element normal vector 352a. As a result, the initially calculated nodal normal vector 357 is adjusted to vector 358, which is parallel to the element normal vector 352a.

Referring back to FIG. 3A, a nodal normal vector $M_1$ 321 is calculated for node $N_1$ 325, and $M_2$ 322 for node $N_2$ 326. Nodes $N_1$ 325 and $N_2$ 326 are the two corner nodes of edge 308 of the element 302. Corner nodes of an element are also configured to be corner control points (i.e., a first set of control points) for creating the smooth contact interface. Therefore, nodes $N_1$ 325 and $N_2$ 326 are two of the first set of the control points for element 302. In addition to the nodal normal vectors, the location vectors for these two nodes $N_1$ 325 and $N_2$ 326 are defined as $L_1$ 315 and $L_2$ 316, respectively in the global coordinate system OXYZ 310.

Figure 3B:
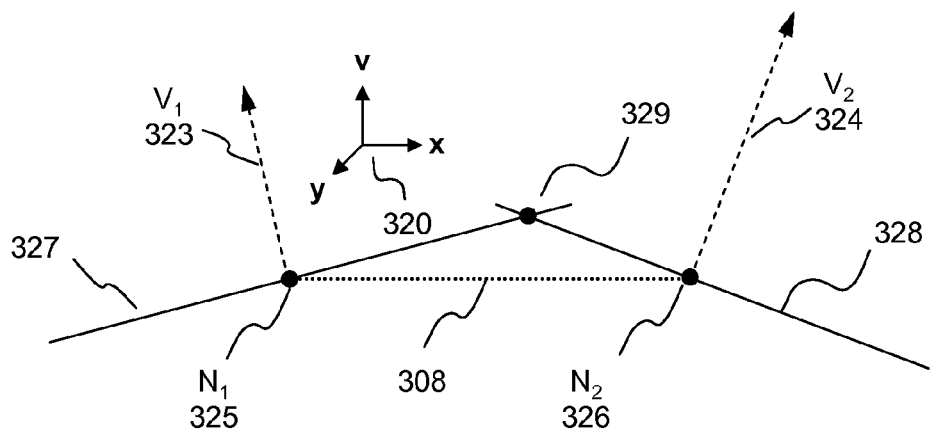
FIG. 3B is a diagram showing an exemplary control point along with two corner nodes in accordance with one embodiment of the present invention.

A local coordinate system (x,v,y) 320 shown in FIGS. 3A and 3B is defined for the edge 308 of the element 302. This local coordinate system 320 is configured for defining the control point between two corner nodes (e.g., $N_1$ 325 and $N_2$ 326). In one embodiment, the local coordinate system (x,v,y) 320 for each edge of an element is created with the following formula:

$$v = (M_1 + M_2)/2$$

$$y = (L_2 - L_1) \times v$$

$$x = v \times y$$

where "×" represents the cross product operator.

After all nodal normal vectors have been established (i.e., calculated and adjusted for special edge condition), the next step is to create edge control points. This is to be done by projecting the nodal normal vector of corner nodes onto the plane (x, v) defined by vectors "x" and "v". FIG. 3B shows an exemplary result of this projection. Projected nodal normal vectors $V_1$ 323 and $V_2$ 324 at corner nodes $N_1$ 325 and $N_2$ 326 for the edge 308 are the projection of nodal normal vectors $M_1$ 321 and $M_2$ 322, respectively. In the (x, v) plane, the edge control point 329 is defined as the intersection of two lines 327 and 328. The line 327 is perpendicular to vector $V_1$ 323 through node $N_1$ 325, while the line 328 is perpendicular to vector $V_2$ 324 through node $N_2$ 326. This process defines a control point for each edge of the element (i.e., three control points for triangular element, four for the quadrilateral). Using only one edge control point, a curved surface can be guaranteed to be fit through corner nodes or control points along with the edge control points. Furthermore, nodal normal vector at each corner node of an element ensures that the curved surface is smooth through the nodes.

Figure 3C:
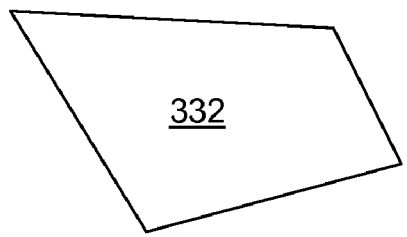
FIG. 3C is a diagram showing an exemplary quadrilateral element with generated control points in accordance with one embodiment of the present invention.
Figure 3C:
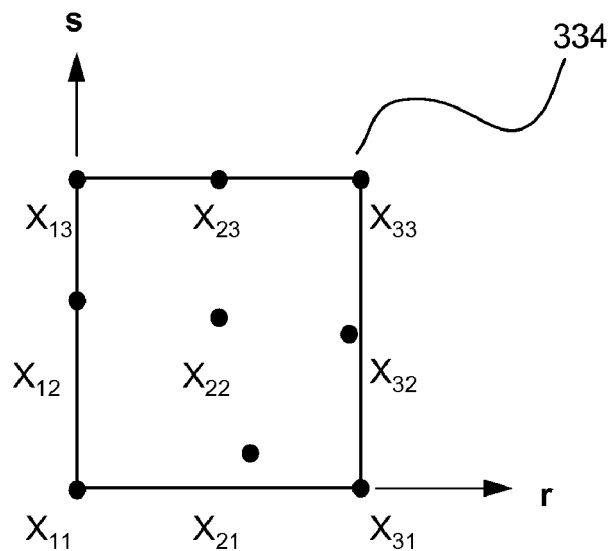
Figure 3D:
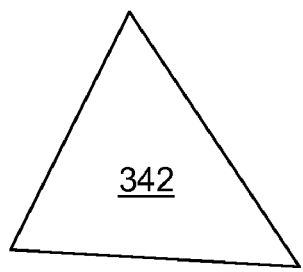
FIG. 3D is a diagram showing an exemplary triangular element with generated control points in accordance with one embodiment of the present invention.
Figure 3D:
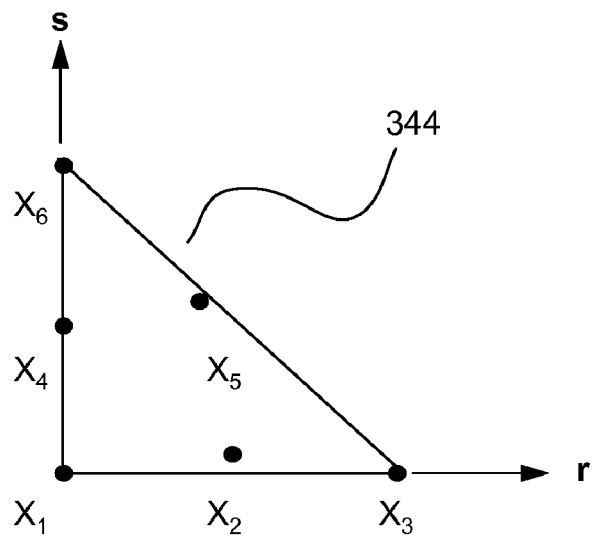

Exemplary edge control points are shown in FIG. 3C as nodes $X_{21}$, $X_{32}$, $X_{23}$, and $X_{12}$ for a quadrilateral element 332 FIG. 3D shows a triangular element 342 with edge control points at nodes $X_2$, $X_4$, and $X_5$. It is noted that the edge control point may not be located on the corresponding edge due to three-dimensional geometry.

Finally, an additional middle or mid-element control point (i.e., point $X_{22}$ in FIG. 3C) is calculated for quadrilateral element. The mid-element control point is generally located at substantially near center of the element. The definition of the mid-element control point is summarized in the following formula:

$$X_{22}=[2(X_{21}+X_{32}+X_{23}+X_{12})-(X_{11}+X_{13}+X_{33}+X_{31})]/4$$

FIG. 3C shows an exemplary quadrilateral element with generated control points in accordance with one embodiment of the present invention. The quadrilateral element 332 has four linear side edges and four corners (i.e., corner nodes). The four corner nodes may or may not be located in a plane. With only the corner nodes, it is not sufficient to represent a smooth curve-fitted surface to be created. Thus a set of control points are generated to facilitate this requirement. Diagram 334 depicts a parametric domain of the quadrilateral element 332 defined in a natural (r,s) coordinate system with nine control points, four corner control points, $X_{11}$, $X_{31}$, $X_{13}$, and $X_{33}$, coincided with the corners, four edge control point, $X_{21}$, $X_{12}$, $X_{32}$, and $X_{23}$, each generated from a pair of adjacent corner nodes, and a mid-element control point $X_{22}$ is located close to the middle of the quadrilateral element 332. The mid-element control point is generated using all corner and edge control points. Smooth patch method curve fitting scheme is used to create the smooth curve-fitted surface. The smooth patch method interpolation function for the quadrilateral master segment is defined as follows:

$$x = B_{ij}(r, s) * X_{ij} \qquad i, j = 1, 2, 3$$

$$B_{ij}(r, s) = N_i(r) * N_j(s)$$

$$N_1(t) = (1 - t) \qquad N_2(t) = 2t(1 - t) \qquad N_3(t) = t^2$$

$$t \in r, s \qquad r = [0, 1] \qquad s = [0, 1]$$

FIG. 3D shows an exemplary triangular element 342 with generated control points in accordance with one embodiment of the present invention. The triangular master segment 342 has three linear side edges and three corners (i.e., corner nodes). Similar to the quadrilateral element, the corner nodes are insufficient to describe a smooth curve-fitted surface. Thus a set of control points are generated to facilitate the description of the smooth curve-fitted surface. Diagram 344 illustrates a parametric domain of the triangular element 342 defined in a natural (r,$) coordinate system with six control points, three corner control points, $X_1$, $X_3$ and $X_6$, coincided with the corner nodes and three edge control points, $X_2$, $X_4$ and $X_5$, each generated from a pair of adjacent corner nodes. Smooth patch method curve fitting technique is used to create the smooth curve-fitted surface. The smooth patch method interpolation function for the triangular segment is as follows:

$$x = B_i(r, s) * X_i \qquad i = 1...6$$

$$B_1(r, s) = (1 - r - s)^2 \quad B_2(r, s) = 2r(1 - r - s) \quad B_3(r, s) = r^2$$

$$B_4(r, s) = 2s(1 - r - s) \quad B_5(r, s) = 2rs \qquad B_6(r, s) = s^2$$

$$r = [0, 1] \qquad s = [0, 1]$$

Figure 3E:
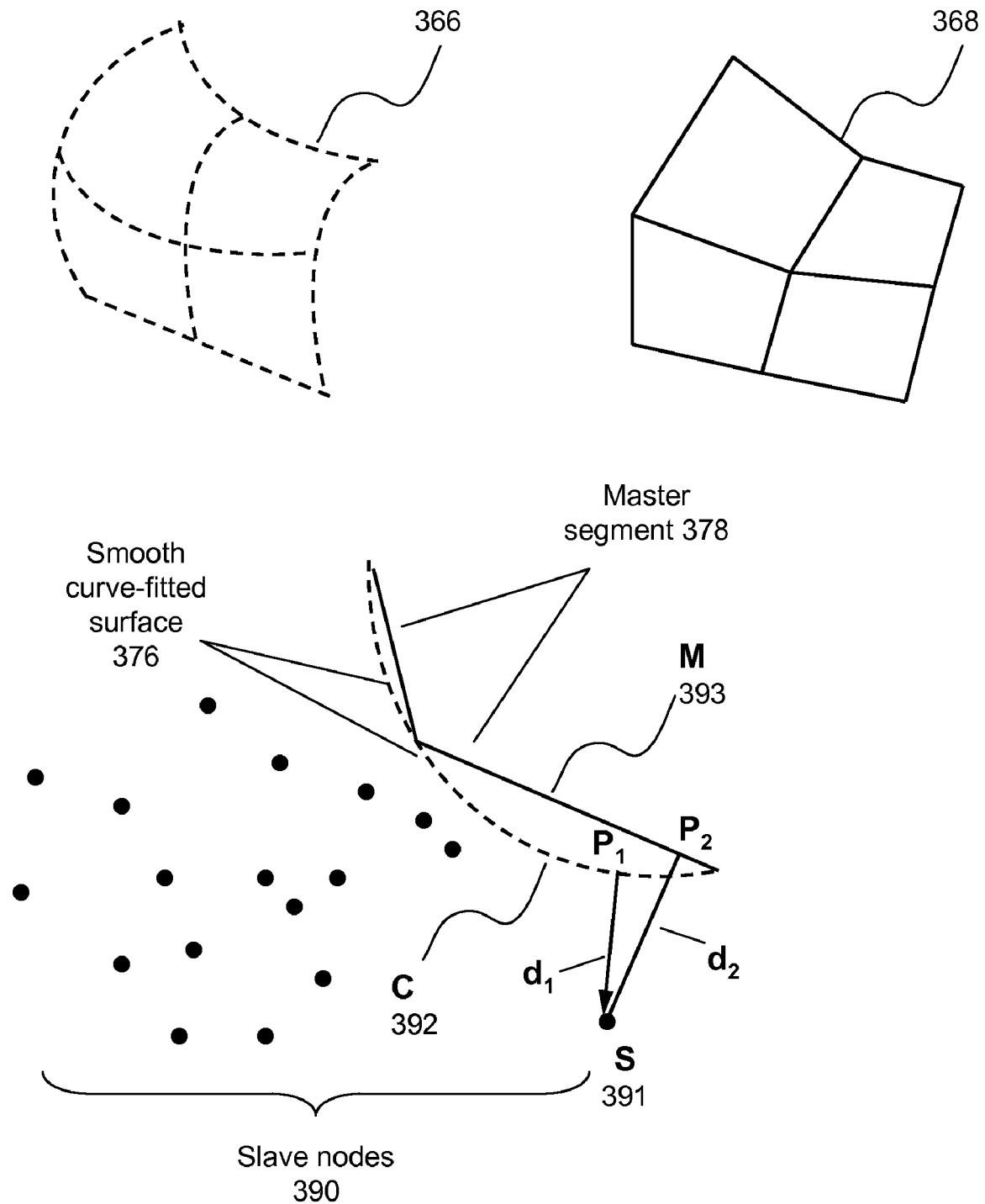
FIG. 3E is a diagram depicting relationship between a number of exemplary slave nodes, an exemplary master segment along with a smooth contact-impact interface in accordance with one embodiment of the present invention.

FIG. 3E shows exemplary slave nodes and a master segment along with an exemplary smooth curve-fitted surface in accordance with one embodiment of the present invention. The master segment 368 and the corresponding smooth curve-fitted surface 366 are depicted in a perspective view. To illustrate the relationship between the slave nodes 390 and a master segment 378 as well as the smooth curve-fitted surface 376, a plane view is shown herein. To detect contact, each of the slave nodes is checked against its closest element in the master segment 378. As an example, a slave node S 391 is checked against the smooth curve-fitted surface C 392 (i.e., smooth contact interface), which associates with the elements M 393. First, a projection point $P_1$ of the slave node S 391 on the smooth curve-fitted surface C 392. The distance $d_1$ can then be determined with the locations of two points S 391 and $P_1$. When the distance $d_1$ is less than zero, a contact between the slave node S 391 and the master segment 378 represented by the smooth contact interface C 392 has been detected. Otherwise, there is no contact. When the contact has been detected, a contact force is calculated based upon the distance $d_1$ and the normal vector between $P_1$ and S 391. Then a non-linear spring between the slave node S 391 and its projection point $P_1$ is created to represent the contact force.

The contact detection process described above requires every slave nodes to be checked against its closest element in the master segment 378. Alternatively, a preliminary contact search can be performed initially to eliminate those slave nodes that have no possibility of making contact with the master segment 378. The rest of the slave nodes are checked against master segments for contact using the process described above. Preliminary contact search can be performed in the following manners. First, a slave node S is checked against its closest element M 393 in a traditional way assuming there is not a smooth curve-fitted surface. The distance $d_2$ is calculated between the slave node S 391 and its projection point $P_2$ on the element M 393. When the distance $d_2$ is greater than a threshold value, the slave node S 391 has no possibility of making contact with the element M 393, thereby being eliminated from a group of potential candidates for contacts. The threshold can be defined by a user or automatically generated as some multiples of the maximum distance between the flat surface and the curve-fitted surface of the segment (i.e., a conservative distance to exclude slave nodes that are impossible to make contact with the master segment).

Figure 4:
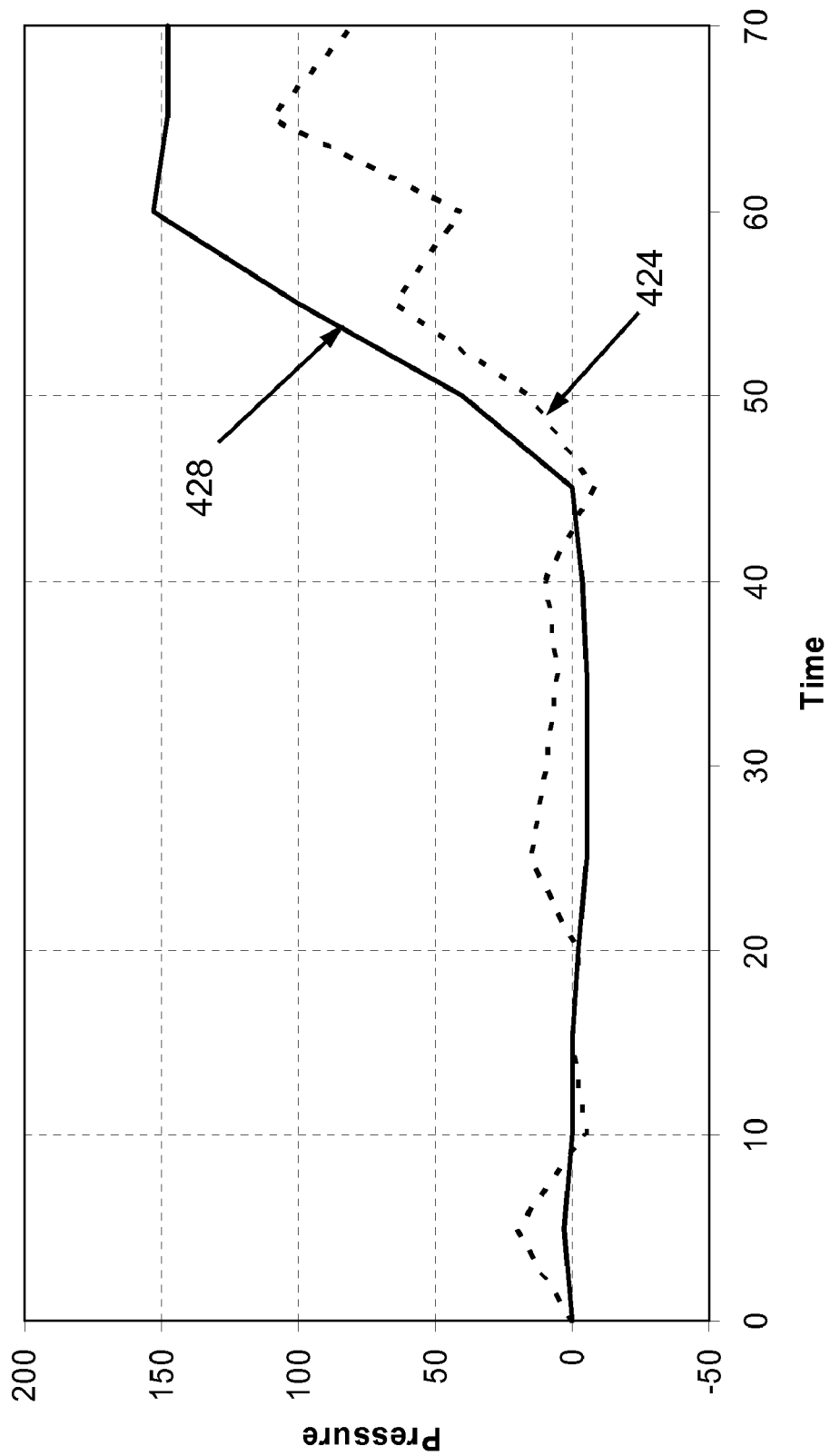
FIG. 4 is a diagram showing a comparison of the results of using contact-impact interface based on a prior art approach and an embodiment of the present invention.

FIG. 4 shows the comparison between the results from a traditional simulation 424 and those from one embodiment of the present invention 428. The results plotted in FIG. 4 are a time history of calculated pressure of a finite element during the time-marching engineering simulation. The vertical axis represents the pressure, while the horizontal axis represents the time. It is evident that the peak values are very different from the traditional analysis. Significant improvements have been achieved and smoother results are obtained compared to the traditional analysis. The traditional method exhibits big oscillation because the master segments are not smooth between elements. The benefit of the present invention is evidently shown for the present invention.

Figure 5A:
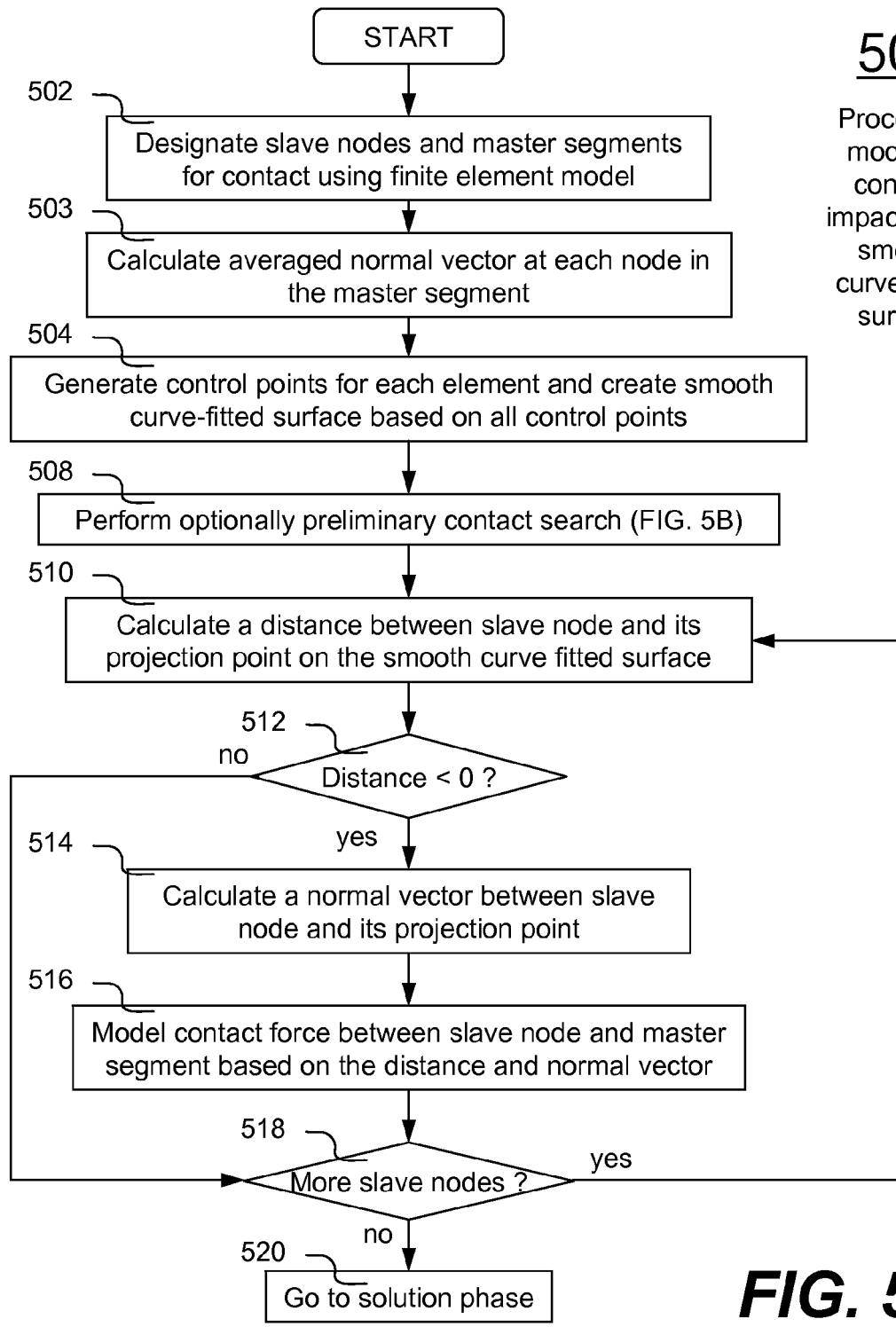
FIG. 5A is a flowchart illustrating an exemplary process of utilizing an improved smooth curve-fitted surface during simulation of contact-impact in a finite element analysis of an engineering product or structure in accordance with one embodiment of the present invention.

FIG. 5A is a flowchart illustrating an exemplary process of utilizing a smooth curve-fitted surface during simulation of contact-impact by FEM in design analysis of a structure in accordance with one embodiment of the present invention. Process 500, which is preferably understood in conjunction with the previous figures especially FIGS. 3A-3E, may be implemented in software, hardware, or a combination of both.

Process 500 starts by receiving a finite element model having at least one master segment and a plurality of slave nodes designated at step 502. The finite element model of a structure is created with a number of nodes and elements defining the geometry and material properties. A part of this finite element model can be designated as at least one master segment. There is no limit as to how many master segments may be designated. Usually the rigid parts of the structure such as die and tooling in the metal forming process are designated as master segment. A master segment may include whole structure, or just a small portion of it.

Because each element in a master segment comprises either 3 or 4 corner nodes, it is not sufficient to describe a surface with curvature. Accordingly process 500 needs to generate additional control points for each element in order to accommodate the description of a curved surface. Next, at step 503, a normal vector is calculated at each node by average element normal vectors that connected to the node (see FIG. 3A and FIGS. 3A-1). At step 504, process 500 generates a set of control points for each of the elements using the nodal normal vectors (FIG. 3B). A smooth curve-fitted surface or smooth contact interface is created by fitting a curved surface all corner nodes and control points.

Process 500 moves to step 508 performing an optional preliminary contact search to identify which ones of the slave nodes have high likelihood of contact with the master segment. Details of this optional step 508 are described in FIG. 5B and corresponding descriptions. After the optional search, process 500 calculates a primary distance between each of the slave nodes and its first projection point on the smooth curve-fitted surface at step 510 (FIG. 3E). Some iteration schemes such as Newton iteration can be used to find the closest distance between the slave node and the smooth curve-fitted surface, i.e. the first projection point on the curve-fitted surface. Process 500 then goes to decision 512 to determine whether the primary distance is less than zero. If 'no', process 500 moves test 518. Otherwise process 500 follows the "yes" branch to step 514, in which a contact normal vector is calculated basing upon the smooth patch method surface fitting function and the first projection point. The contact normal vector is perpendicular to the smooth curve-fitted surface at the first projection point. And the contact-impact between the slave node and the master segment can be modeled based on the primary distance and the contact normal vector at step 516. The contact normal vector is determined by a cross-product of two tangential vectors $\partial x/\partial r$ and $\partial x/\partial s$ respected to two axes "r" and "s" at the first projection point in a local coordinate system depicted in FIGS. 3C and 3D. The "x" is the surface function defined in FIGS. 3B, 3C and 3D, and corresponding descriptions. Then process 500 moves to decision 518 to find out whether there are other slave nodes to be processed. If so, process 500 moves back to step 510 to repeat the above steps until there is no more slave node. Then process 500 moves to the solution phase of the structural design analysis at step 520. It is noted process 500 is performed at each solution cycle of a time-marching engineering simulation.

Figure 5B:
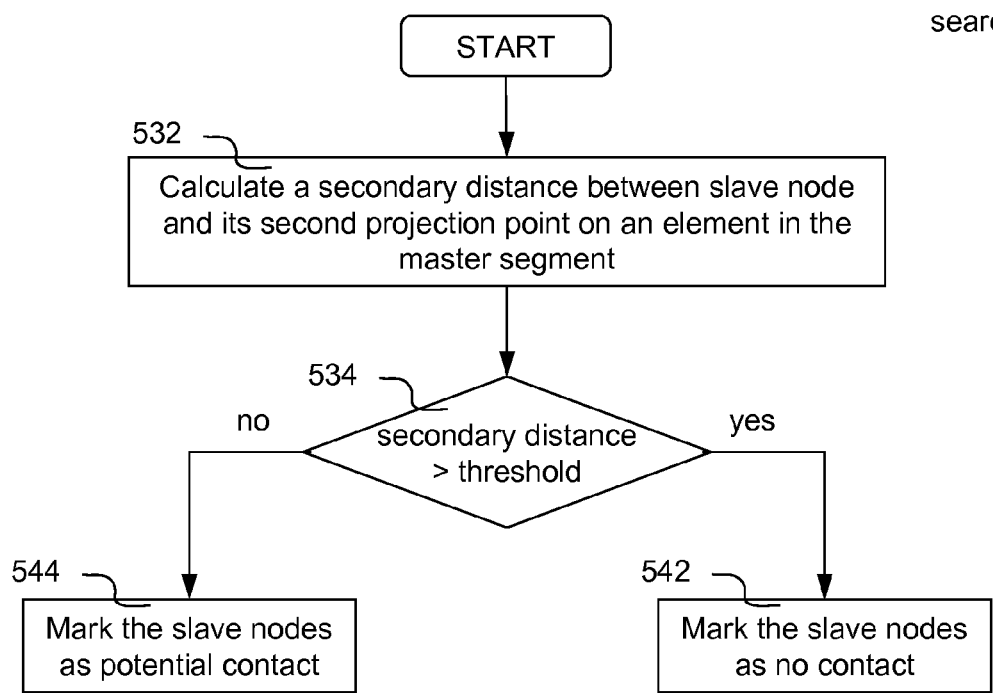
FIG. 5B is a flowchart showing an exemplary process of performing an optional preliminary contact search in accordance with one embodiment of the present invention.

FIG. 5B is a flowchart showing an exemplary process 530 of performing an optional preliminary contact search in accordance with one embodiment of the present invention. Process 530 starts with calculating of a secondary distance between the slave node and its second projection point on an element of the master segment at step 532. Process 530 then moves to decision 534, in which the secondary distance is compared with a threshold value. If the secondary distance is greater than the threshold value, then there is no possibility of contact between the slave node and the master segment at step 542. Otherwise, process 530 marks the slave node with high likelihood of contact at step 544. The threshold value may be defined by user or generated automatically as some multiples of the maximum distance between the flat surface and the curve-fitted surface of the segment.

Figure 6:
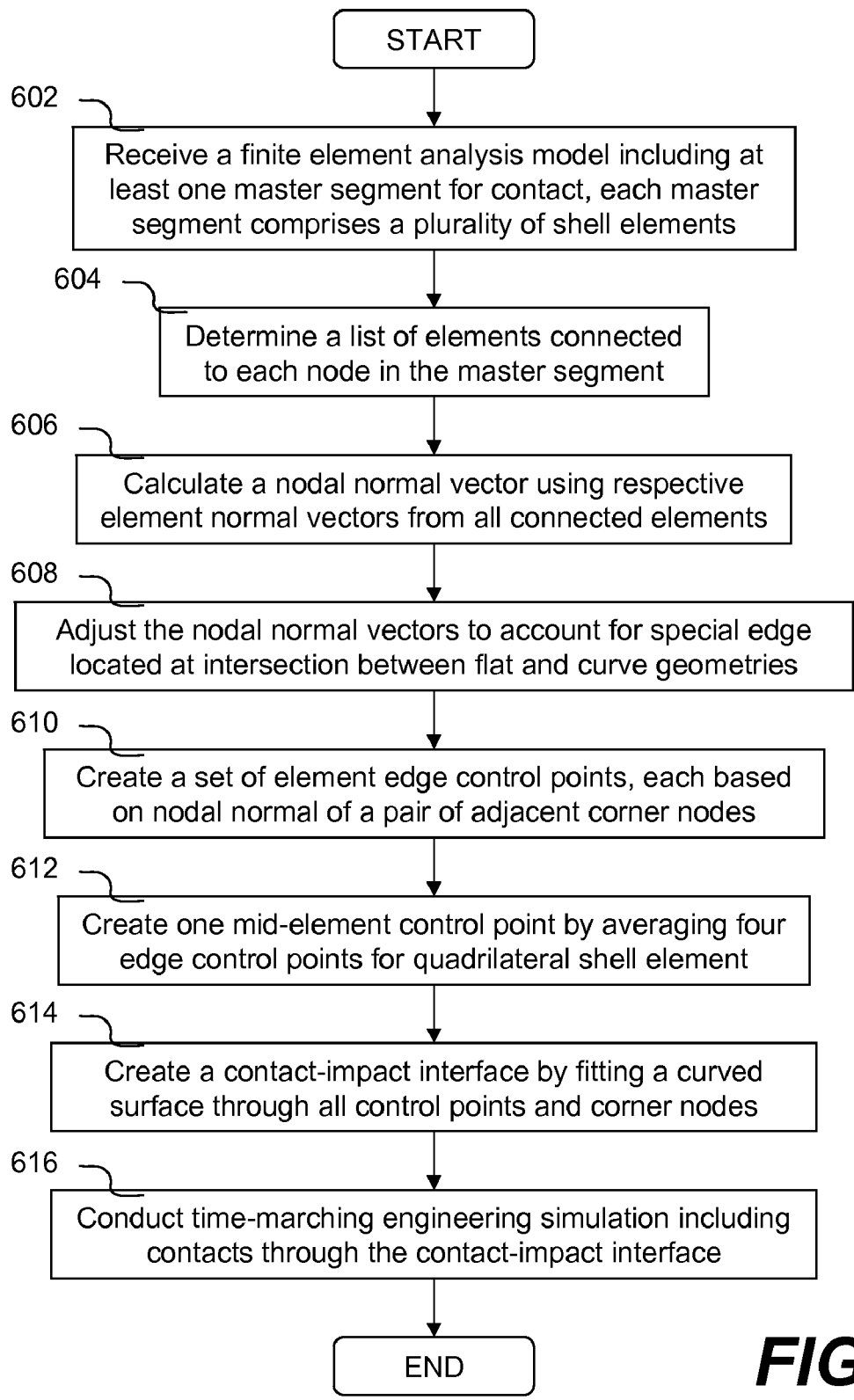
FIG. 6 is a flowchart illustrating an exemplary process of creating smooth contact interface in finite element analysis used for engineering simulation for assisting users to make decision in improvement of an engineering product or structure design, according to another embodiment of the present invention.

Referring now to FIG. 6, there is shown a flowchart illustrating another exemplary process 600 of creating smooth contact interface in finite element analysis used for engineering simulation for assisting users to make decision in improvement of an engineering product or structure design, according to another embodiment of the present invention. Process 600 is preferably implemented in an application module.

Similar to process 500, process 600 starts by receiving a finite element analysis (FEA) model in a computer system at step 602. The FEA model comprises a plurality of nodes and elements to represent an engineering product (e.g., car, airplane, sheet metal forming tools and parts, etc.). Also defined in the FEA model are at least one slave node and at least one master segment for contacts. Each master segment comprises a plurality of two-dimensional finite elements (i.e., shell elements). Generally, the master segment includes both quadrilateral and triangular elements. Then, at step 604, a list of connected elements is determined for each nodes in the master segment, for example, in FIG. 3A, node 325 has four elements 301-4 in the list.

Next, at step 606, an initial nodal normal vector for each node is calculated from respective element normal vectors of all connected elements. Adjustment to the nodal normal vector of a particular node is then performed at step 608, when a special edge between flat and curved geometries is detected at the particular node. A set of edge control points are created from respective pair of adjacent corner nodes for each edge of the elements in the master segment at step 610. In particular, nodal normal vectors of the adjacent corner nodes are used for determining location of the edge control points (FIG. 3B). For quadrilateral elements, a mid-element control point is then created using all corner and edge control points at step 612. It is noted that the corner control points are the corner nodes of an element. (FIGS. 3B-3D)

Next, at Step 614, a Smooth Contact Interface is Created by Fitting a curved surface through all control points of all elements in the master segment. The smooth contact interface is guaranteed to be smooth and continuous due to creation of nodal normal vectors as well as the set of control points in accordance with one embodiment of the present invention.

Finally, at step 616, a time-marching engineering simulation of an engineering product including contacts is conducted using the smooth contact interface. The response of the simulation is used for assisting users (e.g., engineers, scientists, etc.) to make decision in improvement of the engineering product design. Process 600 ends thereafter.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas nodal normal vector has been shown and described at a node having four connected quadrilateral elements, other numbers and types of element can be used to accomplish the same, for example, triangular elements. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method of creating a smooth contact interface in finite element analysis comprising:
   receiving a finite element analysis (FEA) model representing an engineering product in a computer system, the FEA model includes at least one master segment for simulating one or more contacts, wherein the at least one master segment comprises a plurality of nodes and a plurality of shell elements, each of the shell elements comprising a set of corner nodes;
   determining a list of connected elements for each of the nodes in the master segment, each of the connected elements shares at least said each of the nodes;
   calculating an element normal vector for said each of the shell elements;
   calculating a nodal normal vector of said each of the nodes using respective element normal vectors of all from the list of connected elements;
   when said each of the nodes is located at an outside edge of two or more adjoining elements of said connected elements having said respective element normal vectors parallel to one another, adjusting the nodal normal vector to be parallel to said element normal vector;
   creating a set of edge control points from respective pair of adjacent corner nodes at each edge of said each of the shell elements using the nodal normal vector;
   creating a mid-element control point when said each of the shell element is a quadrilateral;
   creating a smooth contact interface using a curve-fitted surface being formed through all of the nodes and the control points of the master segment; and
   conducting a finite element analysis using the FEA model including the smooth contact interface for the one or more contacts, the finite element analysis is used for a time-marching engineering simulation for assisting a user to make decision in improvement of an engineering product design.

2. The method of claim 1, wherein the plurality of shell elements comprises both quadrilateral and triangular shell elements.

3. The method of claim 1, wherein the FEA model further includes a plurality of slave nodes configured in conjunction with the at least one master segment for simulating the one or more contacts.

4. The method of claim 1, wherein the element normal vector is a vector perpendicular to said each of the shell elements.

5. The method of claim 4, wherein the element normal vector is a cross-product of two respective vectors connecting diagonal pair of the corner nodes of said each of the shell elements.

6. The method of claim 1, wherein the nodal normal vector is created by weighted averaging of element normal vectors of all of the connected elements.

7. The method of claim 1, further comprises detecting the special edge by comparing the nodal normal vector at all of the corner nodes of said each of the shell elements against the element normal vector, the special edge is detected when the nodal normal vector at one of the corner nodes is parallel to the element normal vector.

8. The method of claim 1, wherein the set of control points includes a set of corner control points located at respective corner nodes of said each of shell elements and a set of edge control points associating with each edge of said each of shell elements.

9. A computer recordable storage medium containing computer executable instructions which, when executed on a processor, perform a method of creating a smooth contact interface in finite element analysis used for a time-marching engineering simulation for assisting a user to make decision in improvement of an engineering product design, said method comprising:
   receiving a finite element analysis (FEA) model representing an engineering product in a computer system, the FEA model includes at least one master segment for simulating one or more contacts, wherein the at least one master segment comprises a plurality of nodes and a plurality of shell elements, each of the shell elements comprising a set of corner nodes;
   determining a list of connected elements for each of the nodes in the master segment, each of the connected elements shares at least said each of the nodes;
   calculating an element normal vector for said each of the shell elements;
   calculating a nodal normal vector of said each of the nodes using respective element normal vectors of all from the list of connected elements;
   when said each of the nodes is located at an outside edge of two or more adjoining elements of said connected elements having said respective element normal vectors parallel to one another, adjusting the nodal normal vector to be parallel to said element normal vector;
   creating a set of edge control points from respective pair of adjacent corner nodes at each edge of said each of the shell elements using the nodal normal vector;
   creating a mid-element control point when said each of the shell element is a quadrilateral;
   creating a smooth contact interface using a curve-fitted surface being formed being formed through all of the nodes and the control points of the master segment; and
   conducting a finite element analysis using the FEA model including the smooth contact interface for the one or more contacts, the finite element analysis is used for a time-marching engineering simulation for assisting a user to make decision in improvement of an engineering product design.

10. The computer recordable storage medium of claim 9, wherein the plurality of shell elements comprises both quadrilateral and triangular shell elements.

11. The computer recordable storage medium of claim 9, wherein the element normal vector is a vector perpendicular to said each of the shell elements.

12. The computer recordable storage medium of claim 11, wherein the element normal vector is a cross-product of two respective vectors connecting diagonal pair of the corner nodes of said each of the shell elements.

13. The computer recordable storage medium of claim 9, wherein the nodal normal vector is created by weighted averaging of element normal vectors of all of the connected elements.

14. The computer recordable storage medium of claim 9, further comprises detecting the special edge by comparing the nodal normal vector at all of the corner nodes of said each of the shell elements against the element normal vector, the special edge is detected when the nodal normal vector at one of the corner nodes is parallel to the element normal vector.

15. The computer recordable storage medium of claim 9, wherein the set of control points includes a set of corner control points located at respective corner nodes of said each of shell elements and a set of edge control points associating with each edge of said each of shell elements.

16. A system for creating a smooth contact interface in finite element analysis comprising:

a main memory for storing computer readable code for an application module;

at least one processor coupled to the main memory, said at least one processor executing the computer readable code in the main memory to cause the application module to perform operations by a method of:

receiving a finite element analysis (FEA) model representing an engineering product in the system, the FEA model includes at least one master segment for simulating one or more contacts, wherein the at least one master segment comprises a plurality of nodes and a plurality of shell elements, each of the shell elements comprising a set of corner nodes;

determining a list of connected elements for each of the nodes in the master segment, each of the connected elements shares at least said each of the nodes;

calculating an element normal vector for said each of the shell elements;

calculating a nodal normal vector of said each of the nodes using respective element normal vectors of all from the list of connected elements;

when said each of the nodes is located at an outside edge of two or more adjoining elements of said connected elements having said respective element normal vectors parallel to one another, adjusting the nodal normal vector to be parallel to said element normal vector;

creating a set of edge control points from respective pair of adjacent corner nodes at each edge of said each of the shell elements using the nodal normal vector;

creating a mid-element control point when said each of the shell element is a quadrilateral;

creating a smooth contact interface using a curve-fitted surface being formed through all of the nodes and the control points of the master segment; and conducting a finite element analysis using the FEA model including the smooth contact interface for the one or more contacts, the finite element analysis is used for a time-marching engineering simulation for assisting a user to make decision in improvement of an engineering product design.

17. The system of claim 16, wherein the plurality of shell elements comprises both quadrilateral and triangular shell elements.

18. The system of claim 16, wherein the nodal normal vector is created by weighted averaging of element normal vectors of all of the connected elements.

19. The system of claim 16, further comprises detecting the special edge by comparing the nodal normal vector at all of the corner nodes of said each of the shell elements against the element normal vector, the special edge is detected when the nodal normal vector at one of the corner nodes is parallel to the element normal vector.

20. The system of claim 16, wherein the set of control points includes a set of corner control points located at respective corner nodes of said each of shell elements and a set of edge control points associating with each edge of said each of shell elements.

* * * * *